US006488862B1

(12) United States Patent
Ye et al.

(10) Patent No.: US 6,488,862 B1
(45) Date of Patent: Dec. 3, 2002

(54) ETCHED PATTERNED COPPER FEATURES FREE FROM ETCH PROCESS RESIDUE

(75) Inventors: Yan Ye, Campbell; Diana Xiaobing Ma, Saratoga; Gerald Yin, Cupertino, all of CA (US)

(73) Assignee: Applied Materials Inc., Snata Clara, CA (US)

( * ) Notice: Subject to any disclaimer, the term of this patent is extended or adjusted under 35 U.S.C. 154(b) by 0 days.

(21) Appl. No.: 09/428,307

(22) Filed: Oct. 27, 1999

Related U.S. Application Data (62) Division of application No. 08/891,410, filed on Jul. 9, 1997, now Pat. No. 6,010,603.

(51) Int. Cl.$^7$ .................................................. C23F 1/00
(52) U.S. Cl. .............................. 216/67; 216/74; 216/75; 216/78; 438/710; 438/712; 438/715; 438/720; 438/754; 428/577; 428/620; 428/655; 428/663; 428/673
(58) Field of Search ............................. 216/67, 78, 63, 216/74, 75; 438/720, 710, 712, 715, 754; 134/902; 428/577, 620, 655, 663, 674

(56) References Cited

U.S. PATENT DOCUMENTS

| | | | | |
|---|---|---|---|---|
| 3,654,108 A | * | 4/1972 | Smith | 204/164 |
| 4,308,089 A | | 12/1981 | Iida et al. | 156/643 |
| 4,351,696 A | | 9/1982 | Radigan | 156/643 |
| 4,557,796 A | | 12/1985 | Druschke et al. | 156/643 |
| 4,668,335 A | | 5/1987 | Mockler et al. | 156/643 |
| 4,838,994 A | | 6/1989 | Gulde et al. | 156/643 |
| 4,919,750 A | * | 4/1990 | Bausmith et al. | 156/643 |
| 5,186,718 A | | 2/1993 | Tepman et al. | 29/25.01 |
| 5,200,031 A | | 4/1993 | Latchford et al. | 156/659.1 |
| 5,244,535 A | | 9/1993 | Ohtsuka et al. | 156/643 |
| 5,248,384 A | | 9/1993 | Lin et al. | 156/643 |
| 5,302,241 A | | 4/1994 | Cathey, Jr. | 156/664 |
| 5,336,363 A | | 8/1994 | Morita | 156/625 |
| 5,348,619 A | | 9/1994 | Bohannon et al. | 156/664 |
| 5,376,235 A | | 12/1994 | Langley | 156/664 |
| 5,385,867 A | | 1/1995 | Ueda et al. | 437/195 |
| 5,387,315 A | | 2/1995 | Sandhu | 156/646 |
| 5,387,556 A | | 2/1995 | Xiabing et al. | 437/228 |
| 5,462,892 A | | 10/1995 | Gabriel | 437/189 |
| 5,480,051 A | | 1/1996 | Hain | 216/67 |
| 5,578,166 A | | 11/1996 | Hirota | 156/643.1 |
| 5,591,302 A | | 1/1997 | Shinohara et al. | 156/661.11 |

FOREIGN PATENT DOCUMENTS

| | | | |
|---|---|---|---|
| EP | 0 407 169 A2 | 1/1991 | H01J/37/32 |
| JP | 61-128528 A | 6/1986 | H01L/021/302 |
| JP | 02091940 | 3/1990 | |
| JP | 02207418 | 8/1990 | H01B/13/00 |
| JP | 5-275388 | 10/1993 | H01L/21/302 |

OTHER PUBLICATIONS

A. Aliouchouche et al., "Laser chemical etching of copper films", *SPIE*, vol. 2403, pp. 425–434 (1995).
A. Bertz et al., "Effects of the biasing frequency on RIE of Cu in a $Cl_2$–based discharge", *Applied Surface Science*, 91, pp. 147–151 (1995).
W. Chen et al., "Process for Patterning Corrosion–Resistant A1–Cu Conductors", IBM Technical Disclosure Bulletin, vol. 22, No. 4, Sep. 1979.
D. Débarre et al., "The role of gas–phase in the laser etching of Cu by $CCl_4$", *Applied Surface Science*, 96–98, pp. 453–456 (1996).
T. Gessner et al., "Copper Metalization Technology", pp. 1–23.
B.J. Howard et al., "Reactive ion etching of copper in $SiCl_4$–based plasmas", *Appl. Phys. Let.*, 59(8), pp. 914–916 (Aug. 19, 1991).
Y. Igarashi et al., "High Reliability Copper Interconnects through Dry Etching Process", *Extended Abstracts of the 1994 International Conference on Solid State Devices and Materials*, Yokohama, pp. 943–945 (1994).
Y. Igarashi et al., "Thermal Stability of Interconnect of TiN/Cu/TiN Multilayered Structure", *Jpn. J. Appl. Phys.*, vol. 33, pp. 462–465 (1994).
Y. Igarashi et al., "Dry Etching Technique for Subquarter––Micron Copper Interconnects", *J. Electrochem. Soc.*, vol. 142, No. 3, pp. L36–L37 (Mar. 1995).
A. Jain et al., "Thermal dry–etching of copper using hydrogen peroxide and hexafluoroacetylacetone", *Thin Solid Films*, 269, pp. 51–56 (1995).
H. Miyazaki et al., "Copper dry etching using $Cl_2$ gas as a single reactant and its application to ULSI", Semi Technology Symposium (Japan), Session 5, pp. 41–43 (Dec. 1996).

(List continued on next page.)

*Primary Examiner*—Randy Gulakowski
*Assistant Examiner*—M. Kornakov
(74) *Attorney, Agent, or Firm*—Shirley L. Church; Joseph Bach (57) ABSTRACT

Copper can be pattern etched at acceptable rates and with selectivity over adjacent materials using an etch process which utilizes a solely physical process which we have termed "enhanced physical bombardment". Enhanced physical bombardment requires an increase in ion density and/or an increase in ion energy of ionized species which strike the substrate surface. To assist in the removal of excited copper atoms from the surface being etched, the power to the ion generation source and/or the substrate offset bias source may be pulsed. In addition, when the bombarding ions are supplied from a remote source, the supply of these ions may be pulsed. Further, thermal phoresis may be used by maintaining a substrate temperature which is higher than the temperature of a surface in the etch chamber. It is also possible to use a chemically reactive species in combination with the physical ion bombardment without causing copper corrosion problems, so long as the concentration of the chemically reactive ion component is sufficiently low that the etching is carried out in a physical bombardment dominated etch regime.

4 Claims, 9 Drawing Sheets

OTHER PUBLICATIONS

H. Miyazaki et al., "Copper dry etching with precise wafer-temperature control using $Cl_2$ gas as a single reactant", *J. Vac. Sci. Technol.* B 15(2), pp. 237–240 (Mar/Apr. 1997).

K. Ohno et al., "Reactive Ion Etching of Copper Films in a $SiCl_4$ $N_2$, $Cl_2$ and $NH_3$ Mixture", *J. Electrochem. Soc.*, vol. 143, No. 12 (Dec. 1996).

K. Oho et al., "Reaction Ion Etching of Copper Films in $SiCl_4$ and $N_2$ Mixture", *Japanese Journal of Applied Physics*, vol. 28, No. 6, pp. L1070–L1072 (Jun. 1989).

Y. Ohshita et al., "Lower temperature plasma etching of Cu using IR light irradiation", *Thin Solid Films*, 262, pp. 67–72 (1995).

J.J. Ritsko et al., "Laser–assisted chemical etching of copper", *Appl. Phys. Lett.*, 53(1), pp. 78–80 (Jul. 1988).

G.C. Schwartz et al., "Reactive Ion Etching of Copper Films" *J. Electrochem. Soc.*, vol. 130, No. 8, pp. 1777–1779 (Aug. 1983).

S. Seo et al., "Characteristics of an Inductively Coupled $Cl_2$/Ar Plasma and Its Application to Cu Etching", *Electrochemical Society Proceedings*, vol. 95–4, pp. 327–338 (1995).

W. Sesselman et al., "Laser–Induced Desorption and Etching Processes on Chlorinated Cu and Solid CuCl Surfaces", *Appl. Phys.*, A41, pp. 209–221 (1986).

W. Sesselman et al., "The Interaction of Chlorine with Copper. I. Adsorption and surface reaction", *Surface Science*, 176, pp. 32–66 (1986).

W. Sesselman et al., "The Interaction of Chlorine with Copper. II. Bulk diffusion", *Surface Science*, 176, pp. 67–90 (1986).

C. Steinbrüchel, "Patterning of Copper for Multilevel Metallization: Reactive Ion Etching and Chemical–Mechanical Polishing", *Applied Surface Science*, 91, pp. 139–146 (1995).

J. Torres, "Advanced Copper Interconnections for silicon CMOS Technologies", *Applied Surface Science*, 91, pp. 112–123 (1995).

H. Winters, "Etch products from the reaction on $Cl_2$ with Al(100) and Cu(100) and $XeF_2$ with W(111) and Nb", *J. Vac. Sci. Technol.*, B3(1), pp. 9–15 (Jan/Feb. 1985).

H. Winters, "The etching of Cu(100) with $Cl_2$", *J. Vac. Sci. Technol.*, A3(3), pp. 786–790 (May/Jun. 1985).

Y. Ye et al., "0.35–Micron and Sub–0.35–Micron Metal Stack Etch in DPS Chamber—DPS Chamber and Process Characterization", *Electrochemical Society Proceedings*, vol. 96–12, pp. 222–233 (1996).

U.S. patent application, Ser. No. 08/869,798, of Ye et al., filed Jun. 5, 1997.

PCT International Search Report for PCT/US 98/11847, filed Jun. 9, 1998.

\* cited by examiner

PRIOR ART

ETCHED PATTERNED COPPER FEATURES FREE FROM ETCH PROCESS RESIDUE

This application is a divisional application of application Ser. No. 08/891,410, Filed Jul. 9, 1997, now U.S. Pat. No. 6,010,603.

BACKGROUND OF THE INVENTION

1. Field of the Invention

The present invention pertains to a method of pattern etching a copper layer on the surface of a semiconductor device substrate.

2. Brief Description of the Background Art

In the multi level metallization architecture used in present day semiconductor devices, aluminum is generally used as the material of construction for interconnect lines and contacts. Although aluminum offers a number of advantages in ease of fabrication, as integrated circuit designers focus on transistor gate velocity and interconnect line transmission time, it becomes apparent that copper is the material of choice for the next generation of interconnect lines and contacts.

Copper has not been used in the past principally because of fabrication problems. In particular, copper is difficult to etch and therefore device patterning is particularly challenging. Known art in copper patterned etching has been encumbered by selectivity and etch rate issues. Etch rates obtained by purely physical bombardment have been typically about 300 Å–500 Å per minute or less, as described by Schwartz and Schaible, *J. Electrochem. Soc.,* Vol. 130, No. 8, p. 1777 (1983) and by H. Miyazaki et al., *J. Vac. Sci. Technol.* B 15(2) p.239 (1997), respectively. To improve etch rate, various chemical reactants have been used during the etch process. These chemical reactants react with the copper to create volatile species which can then be removed by application of vacuum to the process chamber. However, when such chemical reactants are used, corrosion is a major problem during the fabrication, as copper does not form any self passivating layer like aluminum does. In particular, oxidation of copper increases resistivity; further, in the case of copper interconnect lines, the whole wire line may corrode all the way through, resulting in device failure. Another problem with copper is diffusion into adjacent materials. Typically, a barrier layer is used between copper and adjacent materials, since diffusion of copper into such materials may degrade the material performance properties.

Offsetting the diffusion disadvantage, copper offers improved electromigration performance over aluminum. In fact, in tests to determine the lifetime of an interconnect wire, the electromigration lifetime of a copper wire is approximately 10 times longer than that of aluminum. In addition, as semiconductor device speeds and function are increased, interconnect speed has become critical, and the improved interconnect transmission rates which can be achieved with copper have encouraged circuit designers to look to copper as the solution.

There are two principal competing technologies under evaluation by material and process developers working to enable the use of copper. The first technology is known as damascene technology. In this technology, a typical process for producing a multilevel structure having feature sizes in the range of 0.5 micron ($\mu$m) or less would include: blanket deposition of a dielectric material; patterning of the dielectric material to form openings; deposition of a diffusion barrier layer and, optionally, a wetting layer to line the openings; deposition of a copper layer onto the substrate in sufficient thickness to fill the openings; and removal of excessive conductive material from the substrate surface using chemical-mechanical polishing (CMP) techniques. The damascene process is described in detail by C. Steinbruchel in "Patterning of copper for multilevel metallization: reactive ion etching and chemical-mechanical polishing", *Applied Surface Science* 91 (1995) 139–146.

The competing technology is one which involves the patterned etch of a copper layer. In this technology, a typical process would include deposition of a copper layer on a desired substrate (typically a dielectric material having a barrier layer on its surface); application of a patterned hard mask or photoresist over the copper layer; pattern etching of the copper layer using wet or dry etch techniques; and deposition of a dielectric material over the surface of the patterned copper layer, to provide isolation of conductive lines and contacts which comprise various integrated circuits. An advantage of the patterned etch process is that the copper layer can be applied using sputtering techniques well known in the art. The sputtering of copper provides a much higher deposition rate than the evaporation or CVD processes typically used in the damascene process, and provides a much cleaner, higher quality copper film than CVD. Further, it is easier to etch fine patterns into the copper surface and then deposit an insulating layer over these patterns than it is to get the barrier layer materials and the copper to flow into small feature openings in the top of a patterned insulating film.

Each of the above-described competing technologies has particular process problems which must be solved to arrive at a commercially feasible process for device fabrication. In the case of the damascene process, due to difficulties in the filling of device feature sizes of 0.25 $\mu$m and smaller (and particularly those having an aspect ratio greater than one) on the surface of the dielectric layer, the method of choice for copper deposition is evaporation (which is particularly slow and expensive) or chemical vapor deposition, CVD (which produces a copper layer containing undesirable contaminants and is also a relatively slow deposition process). Further, the CMP techniques used to remove excess copper from the dielectric surface after deposition, also create problems. Copper is a soft material which tends to smear across the underlying surface during polishing. "Dishing" of the copper surface may occur during polishing. As a result of dishing, there is variation in the critical dimensions of conductive features. Particles from the slurry used during the chemical mechanical polishing process may become embedded in the surface of the copper and other materials surrounding the location of the copper lines and contacts. The chemicals present in the slurry may corrode the copper, leading to increased resistivity and possibly even corrosion through an entire wire line thickness. Despite the number of problems to be solved in the damascene process, this process is presently viewed in the industry as more likely to succeed than a patterned copper etch process for the following reasons.

The patterned etch process particularly exposes the copper to corrosion. Although it is possible to provide a protective layer over the etched copper which will protect the copper form oxidation and other forms of corrosion after pattern formation, it is critical to protect the copper during the etch process itself to prevent the accumulation of involatile corrosive compounds on the surface of the etched copper features. These involatile corrosive compounds cause continuing corrosion of the copper even after the application of a protective layer over the etched features.

Wet etch processes have been attempted; however, there is difficulty in controlling the etch profile of the features; in particular, when the thickness of the film being etched is comparable to the minimum pattern dimension, undercutting due to isotropic etching becomes intolerable. In addition, there is extreme corrosion of the copper during the etch process itself.

Plasma etch techniques provide an alternative. A useful plasma etch process should have the following characteristics: It should be highly selective against etching the mask layer material; it should be highly selective against etching the material under the film being etched; it should provide the desired feature profile (e.g. the sidewalls of the etched feature should have the desired specific angle); and the etch rate should be rapid, to maximize the throughput rate through the equipment. Typically, a chlorine-comprising gas is used in the reactive ion etch processing of the copper. Although the chlorine provides acceptable etch rates, it causes the copper to corrode rapidly. The chlorine reacts very fast, but produces reaction byproducts which are not volatile. These byproducts remain on the copper surface, causing corrosion over the entire etched surface. The byproducts can be made volatile subsequent to the etch step by treatment with chemical species which create a volatile reaction product, but by this time the corrosion is already extensive.

An example of a treatment to remove chlorides and fluorides remaining after the etch of a conductive layer is provided in U.S. Pat. No. 4,668,335 to Mockler et al., issued May 26, 1987. In Mockler et al., the workpiece (wafer) is immersed in a strong acid solution, followed by a weak base solution after the etch of an aluminum-copper alloy, to remove residual chlorides and fluorides remaining on the surface after etching. Another example is provided in U.S. Pat. No. 5,200,031 to Latchford et al., issued Apr. 6, 1993. In Latchford et al, a process is described for removing a photoresist remaining after one or more metal etch steps which also removes or inactivates chlorine-containing residues, to inhibit corrosion of remaining metal for at least 24 hours. Specifically, $NH_3$ gas is flowed through a microwave plasma generator into a stripping chamber containing the workpiece, followed by $O_2$ gas (and optionally $NH_3$ gas), while maintaining a plasma in the plasma generator.

Attempts have been made to reduce the corrosion by introducing additional gases during the etch process (which can react with the corrosion causing etch byproducts as they are formed). In addition, gaseous compounds which can react to form a protective film over the sidewalls of etched features as they are formed have been added during the etching process and after the etch process. However, residual corrosion continues to be a problem and the protective film, while protecting from future contact with corrosive species, may trap corrosive species already present on the feature surface.

An example of the formation of a passivating film on pattern sidewalls is presented by J. Torres in "Advanced copper interconnections for silicon CMOS technologies", *Applied Surface Science*, 91 (1995) 112–123. Other examples are provided by Igarashi et al. in: "High Reliability Copper Interconnects through Dry Etching Process", Extended Abstracts of the 1994 International Conference on Solid State Devices and Materials, Yokohama, 1994, pp.943–945; in "Thermal Stability of Interconnect of TiN/CuTiN Multilayered Structure", *Jpn. J. Appl. Phys.* Vol. 33 (1994) Pt. 1, No. 1B; and, in "Dry Etching Technique for Subquarter-Micron Copper Interconnects", *J. Electrochem. Soc.,* Vol. 142, No. 3, March 1995.

If the patterned etch technique is to be used for fabrication of semiconductor devices having copper interconnects, contacts, and conductive features in general, it is necessary to find an etch method which does not create corrosion or a source of future corrosion during the etch process itself.

In addition to controlling corrosion, it is necessary to control the profile of the etched pattern. An example of a technique used for obtaining a high etch rate and highly directional reactive etching of patterned copper films copper is described by Ohno et al in "Reactive Ion Etching of Copper Films in a $SiCl_4$, $N_2$, $Cl_2$, and $NH_3$ Mixture", *J. Electrochem. Soc.,* Vol. 143, No. 12, December 1996. In particular, the etching rate of copper is increased by increasing the $Cl_2$ flow rate at temperatures higher than 280° C. However, the addition of $Cl_2$ is said to cause undesirable side etching of the Cu patterns. $NH_3$ is added to the gas mixture to form a SiN-like protective film that prevents side etching. The etch gas mixture which originally contained $SiCl_4$ and $N_2$ was modified to contain $SiCl_4$, $N_2$, $Cl_4$, and $NH_3$. Thus, protective films formed during etching are used by some practitioners skilled in the art to reducing corrosion (as described above) and by others for controlling the directional etching of the pattern surface.

In the above examples, it is presumed that reactive ion etching which includes the use of a chemical reactant for copper is the technique by which dry etching must be accomplished, and considerable effort is put into techniques for removing the reactive ion etch byproducts from the surface of the patterned copper after etch. Further, at the concentrations of the chemically reactive ions recommended for the etching process, there are problems in controlling the directional etching of the copper film.

SUMMARY OF THE INVENTION

We have discovered that copper can be pattern etched at acceptable rates and with selectivity over adjacent materials using an etch process which utilizes a solely physical basis such as ion bombardment, without the need for a chemically based etch component. We have named the process "enhanced physical bombardment". There are generally four techniques for generation of enhanced physical bombardment.

A first preferred enhanced physical bombardment technique requires an increase in ion density and/or an increase in ion energy of ionized species which strike the substrate surface. An increase in ion density is preferably achieved by placing a device inside the etch chamber above the substrate surface, which device enables an increase in the number of ionized particles striking the substrate surface. An example of such a device is an inductive coil which is used to increase the number of ionized species or to maintain the number of ionized species supplied by another source so than an increased number of ionized species are available to strike the substrate surface.

A second preferred method for increasing the number of ionized species is to feed into the process chamber a microwave-generated plasma produced outside of the chamber.

It is also possible to increase the number of ionized species by increasing the RF power to an external inductively coupled coil or to increase the DC power to a capacitively coupled source for ion species generation. However, these latter two techniques are less preferred methods for increasing ion density, since the copper (and alloy metal(s)) atoms generated during etching affect the performance of an external coil and since capacitively coupled species generation is not very efficient.

By ion energy, it is meant the energy of the ion at the time it strikes the substrate surface. A second preferred enhanced physical bombardment technique is increasing (to the limit that the substrate is detrimentally affected) the ion energy. Ion energy may be increased by increasing an offset bias on the substrate which attracts the ionized species toward the substrate. This is typically done by increasing the RF power to a platen on which the substrate sets. The effectiveness of an increase in the bias power is dependent upon the RF frequency and the ratio of the bias grounding area to the surface area of the substrate. Ion energy is further increased by operating the etch process chamber at a lower pressure.

A third enhanced physical bombardment technique is a pulsing of the ion density or the ion energy.

One preferred means of pulsing the ion energy is to pulse the power to the device which produces the ion species or which is used to increase or maintain the number of ionized species available to strike the substrate surface. Such pulsing is preferably applied to a device located internally within the process chamber. The pulsing may be of the feed rate of an externally-generated plasma into the process chamber. Less preferably, the pulsing may be applied to an external inductively coupled source for plasma generation or to a capacitively coupled source for plasma generation.

An even more preferred means of pulsing the ion energy is by pulsing the power to the offset bias source which is applied to the substrate.

Pulsing of the ion energy reduces the possibility that an excited copper ion leaving the copper surface during etching will reattach to the copper surface in an adjacent location.

The pressure in the process vessel may also be pulsed as a means of pulsing the ion energy.

The fourth enhanced physical bombardment technique is the use of thermal phoresis. Thermal phoresis occurs when the temperature of the substrate surface is higher than the temperature of the etch chamber surfaces (walls), whereby particles dislodged from the higher temperature substrate surface are attracted toward the colder chamber surfaces.

We have also discovered that it is possible to use a combination of physical ion bombardment with a chemically reactive ion component, so long as the concentration of the chemically reactive ion component is sufficiently low that the etching is carried out in a physical bombardment dominated etch regime. Preferably this combination technique is carried out at temperatures above about 150° C. and at pressures below about 50 mT. Since the additional energy provided by the physical bombardment is added to the formation of volatile chemical-reaction-generated compounds, the copper removal rate is not limited solely to the rate of formation of the volatile compounds and the ability of a low process chamber pressure to facilitate removal of such volatile compounds. When physical ion bombardment dominates the etch process, the pressure in the process chamber can be adjusted, to permit increased ion bombardment. An overall synergistic effect occurs, enhancing copper atom removal rate.

The preferred chemically reactive ion species is a halogen-comprising species or compound having a low molecular weight, such as $Cl_2$, HCl, $BCl_3$, HBr, $CHF_3$, $CF_4$, $SiCl_4$, and combinations thereof. When a chlorine-comprising species is used, the chlorine-comprising components present in the feed gases to the etch chamber should be no greater than 30 volume % of the gases fed into the etch chamber during the patterned copper etch. A passivating agent such as $N_2$, $NH_3$, and $CH_4$ may be used in combination with the chemically reactive ion species.

DETAILED DESCRIPTION OF THE PREFERRED EMBODIMENTS

We have discovered that copper can be pattern etched at acceptable rates of greater than about 1,000 Å per minute, preferably greater than about 2,500 Å per minute, and more preferably about 5,000 Å per minute and higher, with selectivity over adjacent materials of about 3:1, using an etch process having a solely physical basis such as physical ion bombardment, without the need for a chemically reactive etch component. We have also discovered that chemically reactive species can be used in controlled amounts (typically about 30% or less by volume of the total gas feed) without incurring undesirable corrosion of the copper, when etching is carrier out in a physically dominated etch regime.

I. DEFINITIONS

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor, reference to a "plasma" includes a gas or gas reactants activated by a glow discharge, and a reference to "copper" includes alloys thereof.

Specific terminology of particular importance to the description of the present invention is defined below.

The term "anisotropic etching" refers to etching which does not proceed in all directions at the same rate. If etching proceeds exclusively in one direction (e.g. only vertically), the etching process is said to be completely anisotropic.

The term "aspect ratio" refers to the ratio of the height dimension to the width dimension of particular openings into which an electrical contact is to be placed. For example, a via opening which typically extends in a tubular form through multiple layers has a height and a diameter, and the aspect ratio would be the height of the tubular divided by the diameter. The aspect ratio of a trench would be the height of the trench divided by the minimal travel width of the trench at its base.

The term "copper" refers to copper and alloys thereof, wherein the copper content of the alloy is at least 80 atomic % copper. The alloy may comprise more than two elemental components.

The term "feature" refers to metal lines and openings on a substrate, and other structures which make up the topography of the substrate surface.

The term "glow discharge sputtering" refers to a mechanism in which atoms are dislodged from a surface which is to be sputtered, by collision with high energy particles which are generated by a glow discharge, where the glow discharge is a self-sustaining type of plasma. The high energy particles may be energetic atoms as well as energetic molecules.

The term "ion bombardment etching" refers to physical bombardment by ions (and other excited species of atoms which are present with the ions) to remove atoms from a surface, where physical momentum transfer is used to achieve the atom removal.

The term "isotropic etching" refers to an etching process where etching can proceed in all directions at the same rate.

The term "plasma" refers to a partially ionized gas containing an equal number of positive and negative charges, as well as some other number of non-ionized gas particles.

The term "physical bombardment dominated etch" or "physical bombardment dominated reactive ion etch" refers to etch conditions under which the etch is dominated by physical bombardment of the film surface. The etch conditions are physically dominated even when a chemically reactive species such as a halogen-comprising species is present, if the etch rate drops or increases by 50% or less when the halogen-comprising species is removed from the etch components so that all remaining etching is attributed to physical momentum.

The term "substrate" includes semiconductor materials, glass, ceramics, polymeric materials, and other materials of use in the semiconductor industry.

II. AN APPARATUS FOR PRACTICING THE INVENTION

A process system in which the method of the present invention may be carried out is the Applied Materials, Inc. (Santa Clara, Calif.) Centura® Integrated Processing System. The system is shown and described in U.S. Pat. No. 5,186,718, the disclosure of which is hereby incorporated by reference.

Dry etch techniques such as plasma etching, whether solely physical ion bombardment or physical ion bombardment combined with chemically reactive ion species, can be carried out in this apparatus, where at least one reaction chamber is outfitted for the etch process described herein. In particular, with reference to FIG. 1, the etch chamber 10 must include at least one inductive coil segment 12 which is connected to a radio frequency (RF) power generator 18 through an impedance matching network 20 to provide RF power within the chamber which is used to generate a plasma by inductive coupling. The substrate 14 (to be etched) is placed on a substrate support platen 16 which is disposed adjacent to at least one inductive coil segment 12. (The spacing shown in FIG. 1 between substrate 14 and inductive coil segment 12 is not indicative of the actual spacing. In fact, the chamber can take on any advantageous shape and the spacing between the at least one inductive coil segment and the surface of the substrate to be etched may take on any configuration which provides the desired power deposition pattern) The material of construction of etch chamber 10 wall 30 is a conductive material, such as aluminum. The aluminum is protected from etchant species by a coating 32 which may be an insulator, such as aluminum oxide, or may be a conductive ceramic material such a boron carbide.

Figure 1:
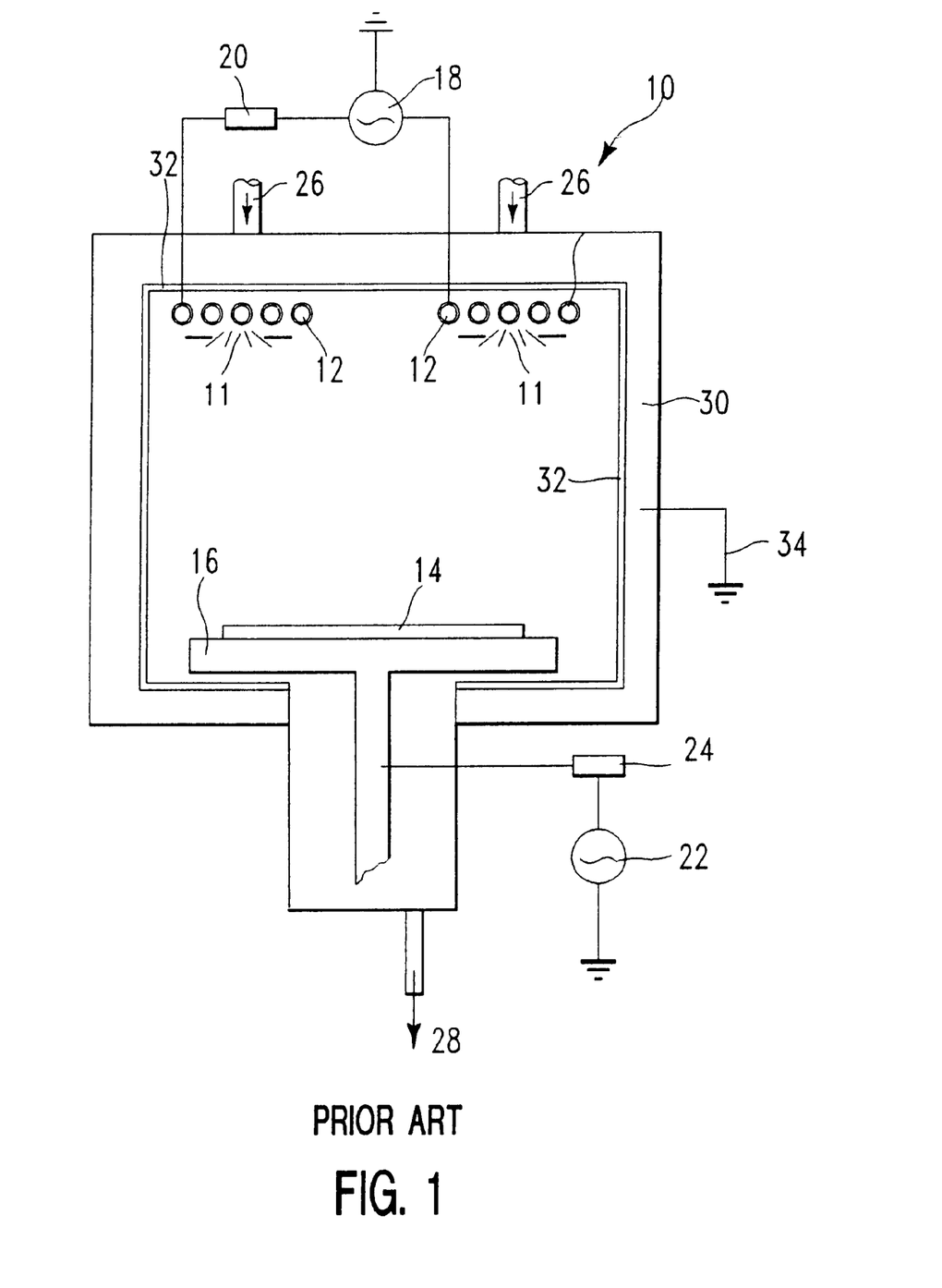
FIG. 1 is a generalized schematic of a cross-sectional view of one of the preferred designs for a prior art plasma etch reactor which can be used to practice the present invention. The plasma etch reactor is constructed to include at least one inductive coil antenna segment positioned interior to the reactor chamber and connected to a radio frequency (RF) power generator through an impedance matching network; a substrate support pedestal also connected to an RF frequency power generator through an impedance matching network; and a conductive chamber wall which serves as the electrical ground for the offset bias which accumulates on the substrate as a result of the RF power connected to the substrate support pedestal.

Substrate support platen 16 is connected to an RF power generator 22 through an impedance matching network 24 to provide a DC offset voltage on the surface of substrate 14. The etch chamber 10 wall 30 serves as the ground 34 for the substrate 14 DC offset voltage.

Gaseous component feed to the plasma created by inductive coil segment 12 enters the etch chamber 10 through inlet lines 26, which lead to a gas inlet manifold (not shown) which supplies gas 11 in the near vicinity of inductive coil segment 12. Pressure (vacuum) interior to etch chamber 10 is controlled using a vacuum pump (not shown) connected to gas exit line 28.

The temperature in etch chamber 10 is typically controlled using liquid-containing conduits (not shown) which are located in the wall 30 of etch chamber 10.

An etch chamber of the kind described above is described in detail in U.S. patent application Ser. No. 08/869,798 of Yan Ye et al., titled: "RF Plasma Etch Reactor With Internal Inductive Coil Antenna And Electrically Conductive Chamber Walls", filed Jun. 5, 1997 and assigned to the assignee of the present application; this patent application is hereby incorporated herein by reference in its entirety.

III. THE METHOD OF ACHIEVING PATTERNED COPPER ETCH USING TECHNIQUES IN THE PHYSICAL REGIME

The preferred embodiment etching methods described herein were practiced in a Centura® Integrated Processing System available from Applied Materials of Santa Clara, Calif. The etch process chamber is capable of processing an 8 inch (200 mm) diameter silicon wafer. The substrate was a silicon wafer having a silicon oxide surface layer overlaid by a 500 Å thick barrier layer of tantalum, with a 5,000 Å thick layer of copper sputter deposited over the barrier layer. A 250 Å thick layer of tantalum was applied over the copper layer, and a 5,000 Å thick patterned silicon oxide hard mask was applied over the tantalum layer.

An argon plasma was created in the etch chamber using standard techniques. An internal inductive coil preferably having from 1–3 coils (and for purposes of the preferred embodiments described herein, a single coil) was used to produce the argon plasma (the ion density). The RF power applied to this inductive coil had a frequency ranged between about 100 kHz and about 13.56 MHz, and a wattage ranging from about 100 W to about 18 kW (preferably between about 100 W and about 5 kW). The surface of the substrate to be etched was placed at a distance of about 2 in. (5 cm) to about 8 in. (20 cm) from the inductive coil. A substrate offset bias was created by application of RF power at a frequency ranging from about 100 kHz to about 13.56 MHz and a wattage ranging from about 100 W to about 5 kW to the substrate support platen. Preferably the power to the support platen ranges from about 200 W to about 3,000 W. Typically the RF power was set to provide an ion bombardment energy higher than about 100 ev. The ratio of the RF grounding area to the area of the substrate was greater than about 1.5:1, and preferably greater than about 2:1. The pressure in the etch chamber ranged between about 0.001 mT to 50 mT, and was preferably below about 20 mT. The temperature on the substrate surface ranged from about 20° C. to about 400° C., while the temperature of an etch chamber surface was preferably at least 30 degrees lower than the substrate temperature. Typically the etch chamber surface was maintained at about 80° C. or less.

A good etch process for patterning of a copper layer should meet at least the following requirements: A high etch rate must be attainable; there must be high selectivity between the copper and the resist material used for patterning; the profile of the etched feature should be straight.

EXAMPLE ONE
Etch Rate

Figure 2:
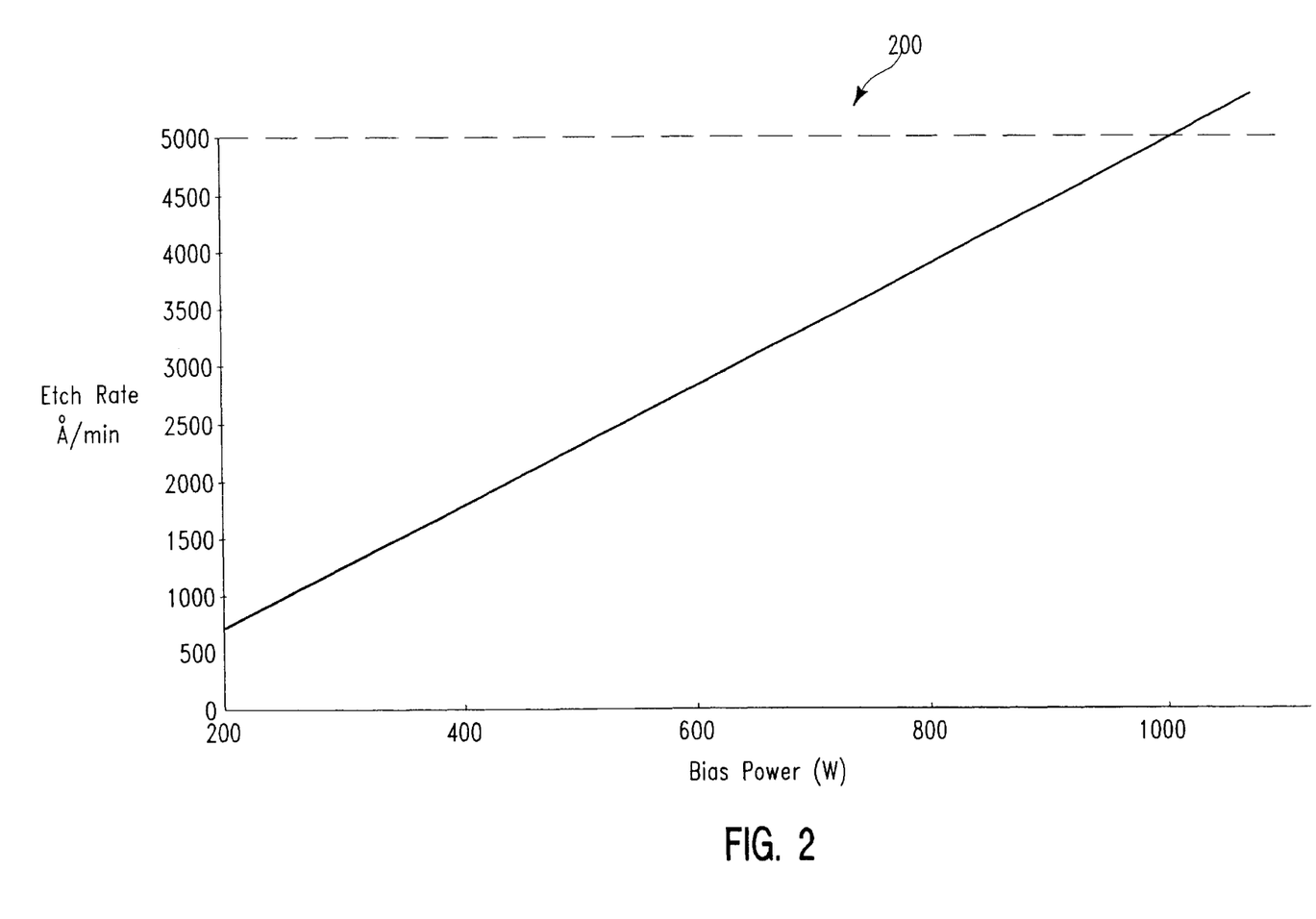
FIG. 2 is a graph showing the etch rate in Å/min of a copper film as a function of the RF bias power to the substrate support platen (which correlates directly with the DC offset bias voltage of the substrate).

Copper film can be etched at etch rates in excess of 5,000 Å per minute using solely the momentum provided by physical ion bombardment. FIG. 2 shows a graph 200 of etch rate data in Å/min of a sputter deposited copper film, as a function of bias power applied to the substrate support platen in Watts (at 13.56 MHz). The etch rate data is for etching the physical vapor deposited (PVD) deposited copper film through to a silicon oxide surface on a blank wafer. The gas feed to the etch chamber was 100 sccm of argon. Power to the inductive coil used to create the plasma was 1000 W at 2 MHz. Pressure in the etch chamber was 10 mT, and the substrate surface temperature was approximately 45° C., while the etch chamber wall was about 80° C.

Based on the information provided in graph 200, a typical wafer having a copper film on its surface could be etched (for most features) in about one minute at a bias power of about 800 W. This is entirely unexpected based on the prior art which goes to great lengths to propose that reactive ion etching at high concentrations of reactive ions is required to achieve satisfactory copper etch rates.

Graph 200 represents only one frequency and only one ratio of the bias grounding area to the area of the substrate. These variables can also be adjusted to provide more rapid etch rates and one skilled in the art will want to optimize this combination of variables.

EXAMPLE TWO
Selectivity

Figure 3:
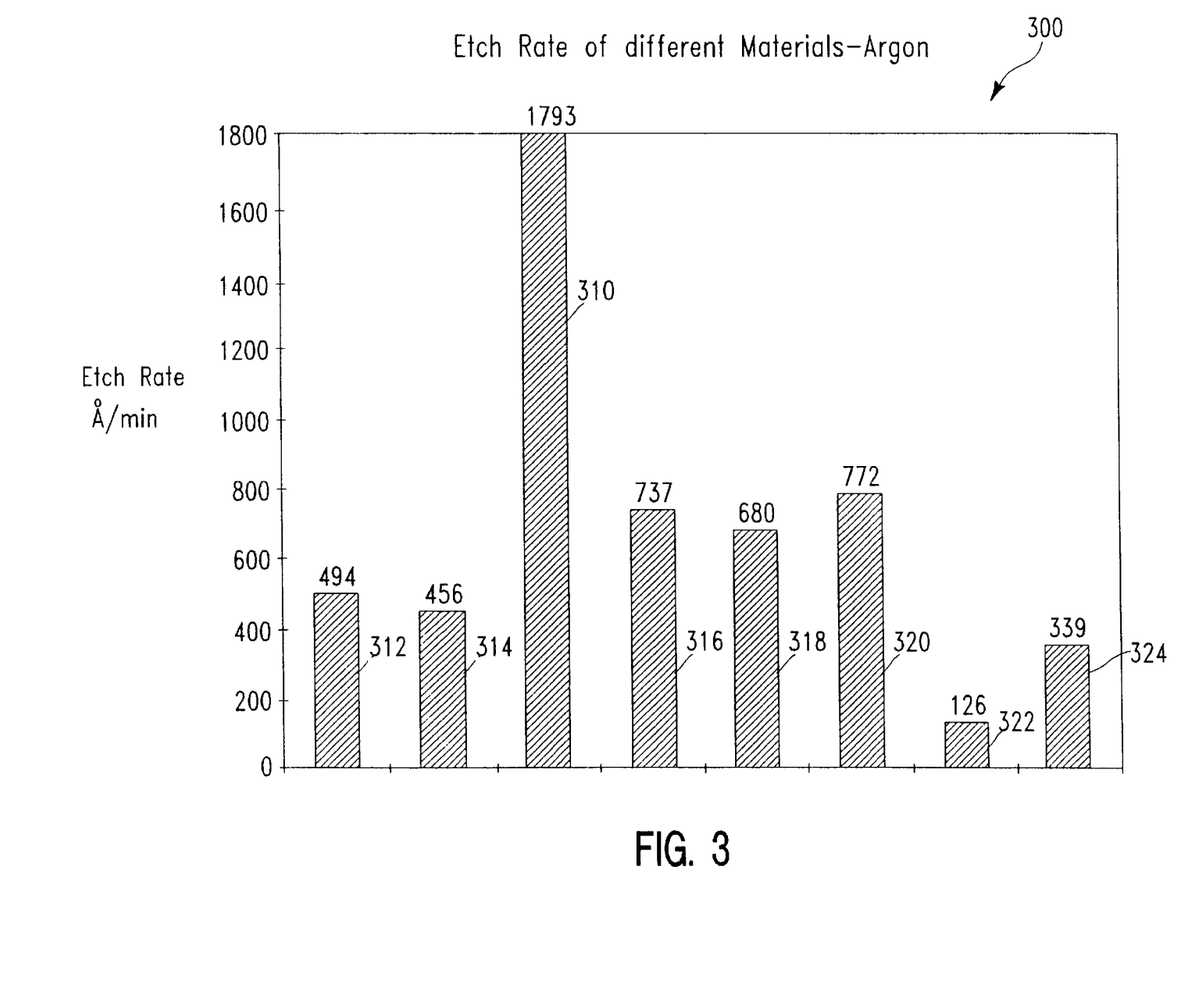
FIG. 3 is a block diagram showing the comparative etch rate of various film materials (including copper) using argon as the feed gas to the etch chamber (physical ion bombardment of the film surface to accomplish etching).

FIG. 3 shows a block diagram 300 of the etch rate attainable for a copper film patterned in the manner described above, with comparative etch rates for a number of different materials when the feed gas to the etch chamber is solely argon. The etch variables were as specified for Example One, with the bias power applied to the substrate support platen fixed at 400 W. The number at the top of an individual block is the etch rate in Å/min as measured. The block identified as "310" represents copper; block "312" represents aluminum; block "314" represents silicon dioxide; block "316" represents tantalum; block "318" represents tantalum nitride; block "320" represents tungsten, block"322" represents titanium nitride, and block "324" represents i-line photoresist (available from Shipley Co.).

As is evident from block diagram 300, there is a marked difference in etch rate between copper and many of the compounds and elements which are likely to be present in layers adjacent to the copper layer, providing excellent selectivity between copper and such other materials. This is quite different from aluminum (block "312"), which provides minimal selectivity from silicon oxide (block"314"), and from the photoresist (block "324") as well as from most of the other materials evaluated. Thus, it is readily apparent that a purely physical ion bombardment for the etch of patterned aluminum layers was not feasible. Evidently those skilled in the art have presumed that such a physical ion bombardment of copper would be ineffectual as well, or that such an etching technique did not appear to be satisfactory under etch conditions previously evaluated.

Figure 4:
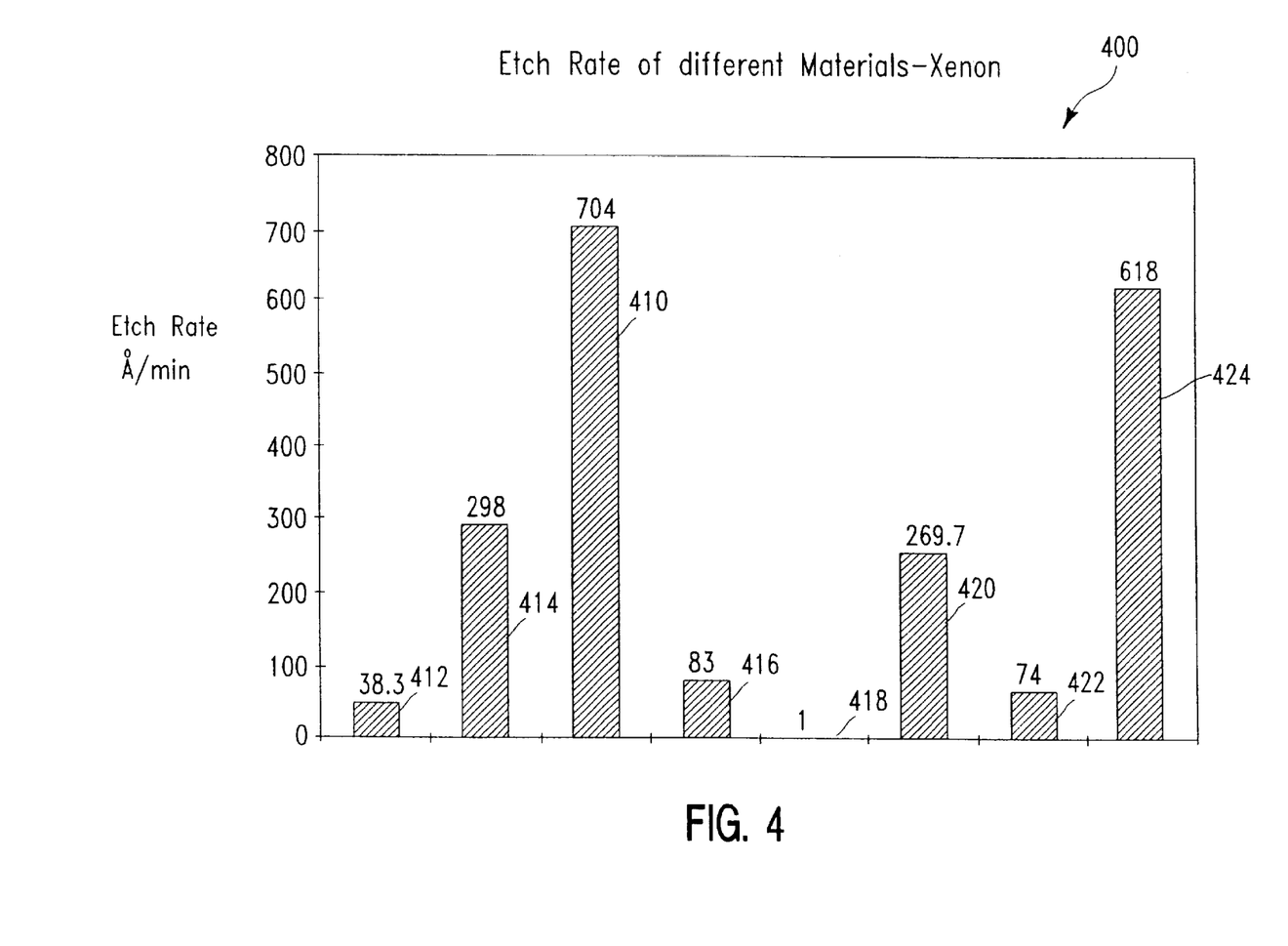
FIG. 4 is a block diagram showing the comparative etch rate of the same film materials as shown in FIG. 3, under the same process variable conditions, except that xenon was used as the feed gas to the etch chamber.

FIG. 4 provides a block diagram 400 of the etch rate attainable for a patterned copper film, with comparative etch rates for a number of different materials when the feed gas to the etch chamber is solely xenon. The etch variables were as specified for Example One, except that xenon was the feed gas to the etch chamber. In addition, the bias power applied to the substrate support platen was fixed at 400 W. The number at the top of an individual block is the etch rate in Å/min as measured. The block identified as "410" represents copper; block "412" represents aluminum; block "414" represents silicon dioxide; block "416" represents tantalum; block "418" represents tantalum nitride; block "420" represents tungsten, block"422" represents titanium nitride, and block "424" represents i-line photoresist.

As is evident from block diagram 400, there is a marked difference in etch rate between copper and many of the compounds and elements which are likely to be present in layers adjacent to the copper layer, providing excellent selectivity between copper and such other materials. Although xenon does not provide the excellent selectivity between copper (410) and the photoresist (424) which was provided by argon, the selectivity between copper (410) and silicon oxide (414) remains excellent, so that a hard mask would work well with a xenon etch gas. In addition, a xenon etch gas provides better selectivity between copper (410) and tantalum (418) and between copper (410) and tantalum nitride (418) than provided by an argon etch gas. Thus, one skilled in the art can select the proper inert etch gas for physical ion bombardment etching.

EXAMPLE THREE
Enhanced Physical Bombardment Using Soley Physical Techniques

Although physical ion bombardment provides satisfactory etch rates for copper and the selectivity needed with regard to other fill materials typically used in semiconductor fabrication, there is typically a slight slope in an etched line profile, with a broadening toward the base of the line. The amount of slope does not provide a problem for feature sizes of about 0.5 μm or larger. However, for feature sizes of about 0.35 μm or larger, there is a need to assist the physical ion bombardment techniques so that copper atoms dislodged from the surface of the forming line do not reattach at another location upon the line surface. When there is not a clear path for the copper atoms to the upper surface of the copper film being pattern etched, these atoms may reattach to the line surface before the vacuum applied to the etch chamber can carry them away from the substrate surface. As the line is forming, the distance the copper atoms must travel to reach the upper surface of the copper film in increasing and the reattachment problem increases at the base of the forming line. As a result, the line profile may be similar to that shown in FIG. 6A, which shows a schematic of the cross-sectional profile of an etched copper pattern of 0.5 micrometer lines and spaces.

Figure 5:
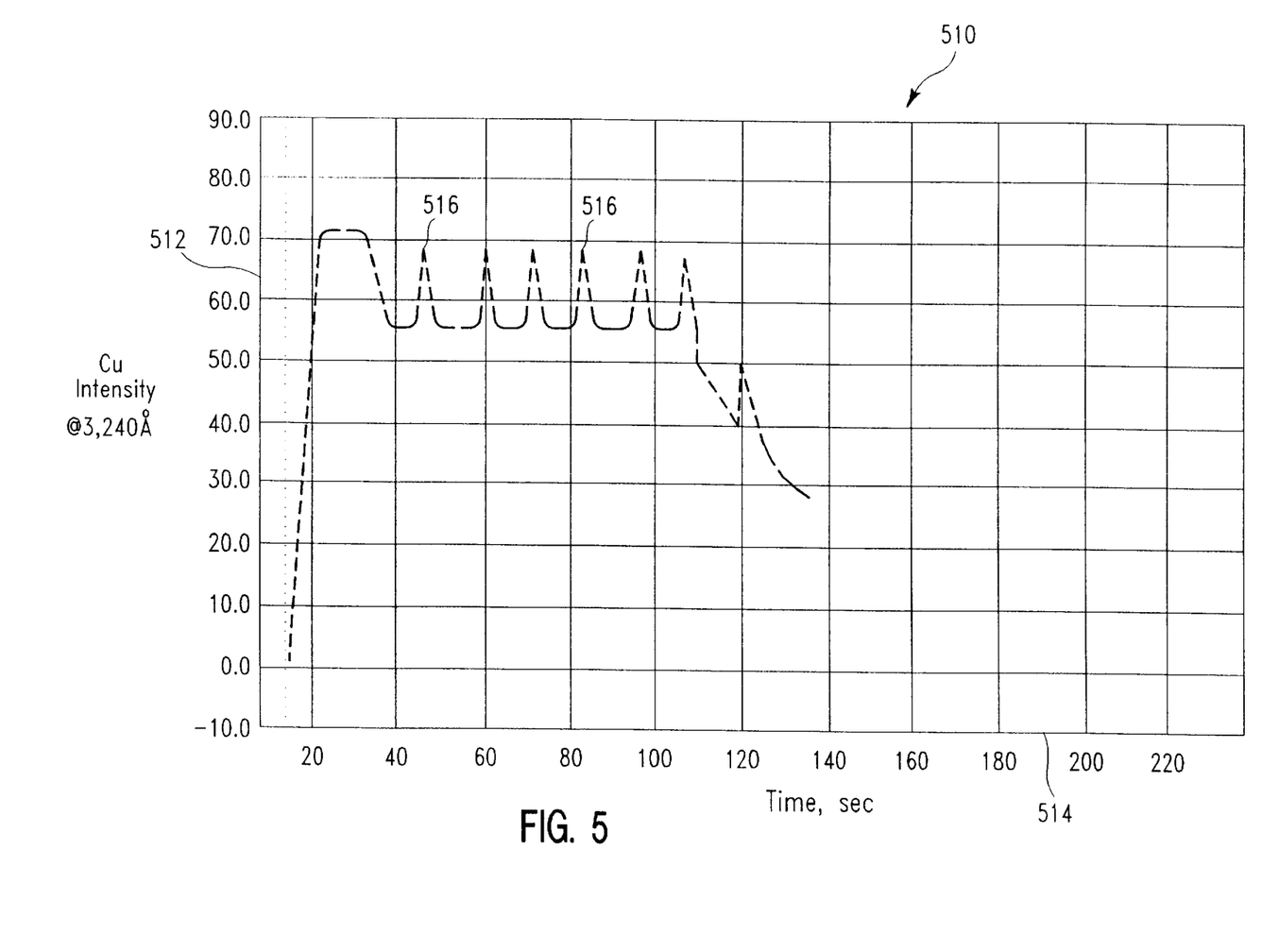
FIG. 5 is a diagram showing the intensity of excited copper atoms in the vapor space above the copper film during pattern etching where the RF bias power to the substrate support platen (the offset bias of the substrate) is pulsed during a patterned etch.

FIG. 5 shows a plot 510 of the intensity reading from an optical emission spectrometer monitoring the copper content in the vapor space overlying the substrate surface during a patterned copper etch. (The spectrometer is included in the Centura® etch system as an end point detector and operates at a wavelength of 3,240 Å. The detection window is about 1 in. (2.5 cm) above the substrate surface.) The intensity reading 512 is shown as a function of time 514, while the RF bias power to the substrate support platen was pulsed. The spikes 516 on plot 510 which indicate a higher intensity measurement for copper in the vapor space correspond with the time at which the RF bias power was not active. (The bias power was fully on for about 8 sec. and then fully off for about 2 sec.) The higher copper intensity is believed to occur due to the release of copper from the etched surface.

Figure 6A:
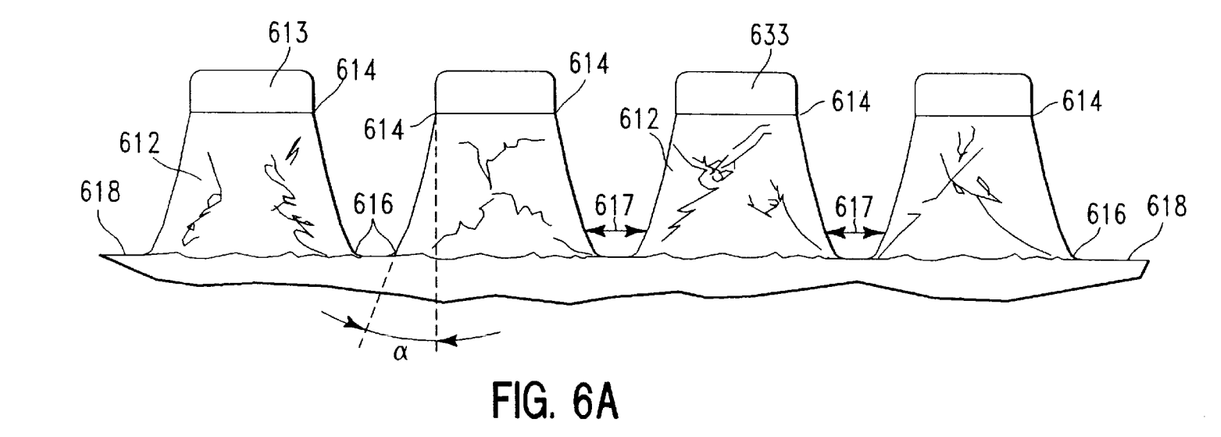
FIGS. 6A and 6B are each a schematic of the cross-sectional profile of an etched copper pattern of 0.5 micrometer lines and spaces without and with pulsing of the RF power to the substrate support platen, respectively.
Figure 6B:
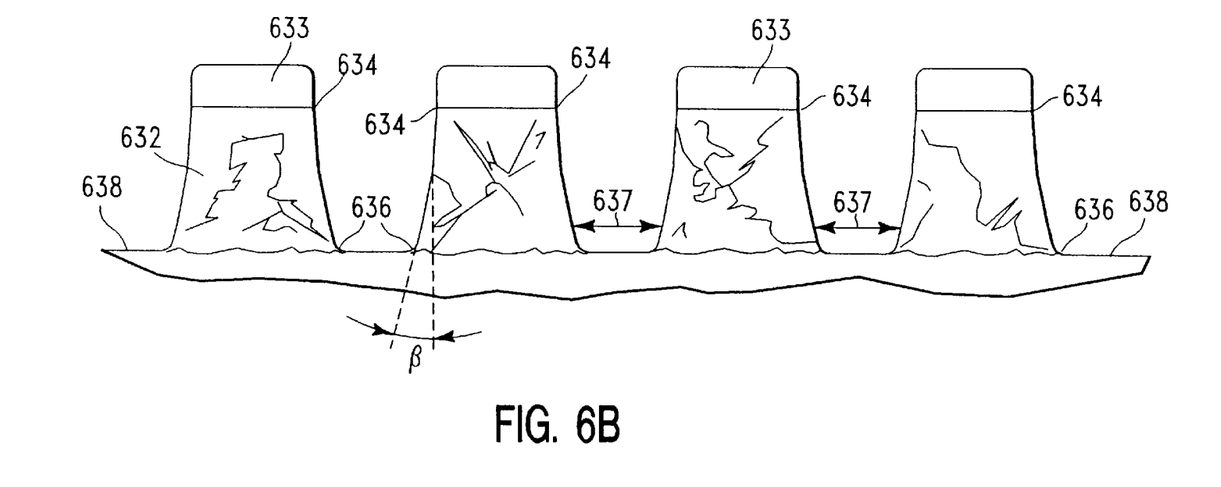

FIGS. 6A and 6B show schematics of the cross-sectional profile of an etched copper pattern of 0.5 micrometer lines and spaces, etched without and with pulsed power to the substrate support platen 16 within etch chamber 10 (FIG. 1). The substrate etched was as described initially herein. An argon plasma was created in the etch chamber using standard techniques. About 500 watts of RF power was applied to the substrate support platen at a frequency of about 13.56 MHz. The pulse timing was power on for about eight seconds and then off for about two seconds, repeating. The power to the single coil inductive source for plasma generation was set at 500 W and a frequency of 2 MHz. (Although it would be possible to synchronize the bias power pulsing with a pulsing of power to the inductive coil, that was not done in this particular instance.) The surface of the substrate to be etched was placed at a distance of about 4 in. (10 cm) from the inductive coil. The pressure in the etch chamber was about 10 mT, the substrate surface temperature was about 45° C., and the etch chamber wall temperature was about 80° C.

FIG. 6A shows a schematic 610 of the cross-sectional profile of the lines and spaces produced when the power to the substrate support platen was not pulsed. The width of profile 612 at its upper edge 614 (just beneath overlying silicon oxide resist 613) was considerably more narrow than the width of profile 612 at its base 616. The width of the space 617 between the lines at their base 616 was not the desired 0.5 $\mu$m because the base 616 of line profile 612 extended into such desired space. The desired angle between the vertical wall of line profile 612 with the substrate surface is 90°. The actual angle obtained was about 70°, with an undesired variation, shown as angle $\alpha$, of about 20°.

FIG. 6B shows a schematic 630 of the cross-sectional profile of the lines and spaces produced when the power to the substrate was pulsed. The width of profile 632 at its upper edge 634 Oust beneath silicon oxide resist 633) more closely approached the width of profile 632 at its base 636. The width of the space 637 between two lines at their base was much closer to the desired 0.5 $\mu$m, because fewer copper atoms reattached at the base 636 of line profile 632. In this case, the angle obtained between the vertical wall of line profile 632 and the substrate 638 was about 80°, with an undesired variation, shown as angle $\beta$, of about 10°.

EXAMPLE FOUR
Enhanced Physical Bombardment Combined with a Chemically Reactive Species An alternative method for improving a line profile, (alterative to enhanced physical bombardment which is solely physical in nature) is the use of a combination of enhanced physical bombardment with a chemically reactive species. The chemically reactive species is used at a concentration greatly reduced over that previously known in the art and works a synergistic effect with the additional energy supplied by the enhanced physical bombardment, as previously described.

The use of a chemically reactive etchant provides a degree of anisotropic etching of the sidewall of the line. The anisotropic etching helps in the removal of physical ion bombarded copper atoms which tend to redeposit/reattach upon the etched profile as they exit the copper surface. A portion of such copper atoms exit at an angle, causing such redeposition. At times these copper atoms stick to the wall of the photoresist or hard mask and etched features, where they accumulate. This enlarges portions of the etched features, so the adjacent copper is not etched. To improve the etched pattern sidewall profile, we looked for a chemically reactive (with copper) material which would be sufficiently attracted to the copper surface to provide some anisotropic etching of the side walls.

In particular, we looked for a chemically reactive material which was effective at sufficiently low concentrations that physical ion bombardment could remain the dominating etch mechanism while the chemically reactive material would assist in the removal of exited copper atoms which would otherwise redeposit on the sidewall of the line or attach to etch masking materials. We discovered that low concentrations of halogens, and particularly chlorine can be used, where the volume % of the halogen-comprising gases entering the etch chamber is less than about 30% of the total volume of gases entering the etch chamber. For example, chlorine assists in the formation of copper chloride $CuCl_x$ where x ranges from about 1 to about 3. These copper chloride compounds are volatile and can be removed to assist in profile control.

Figure 7:
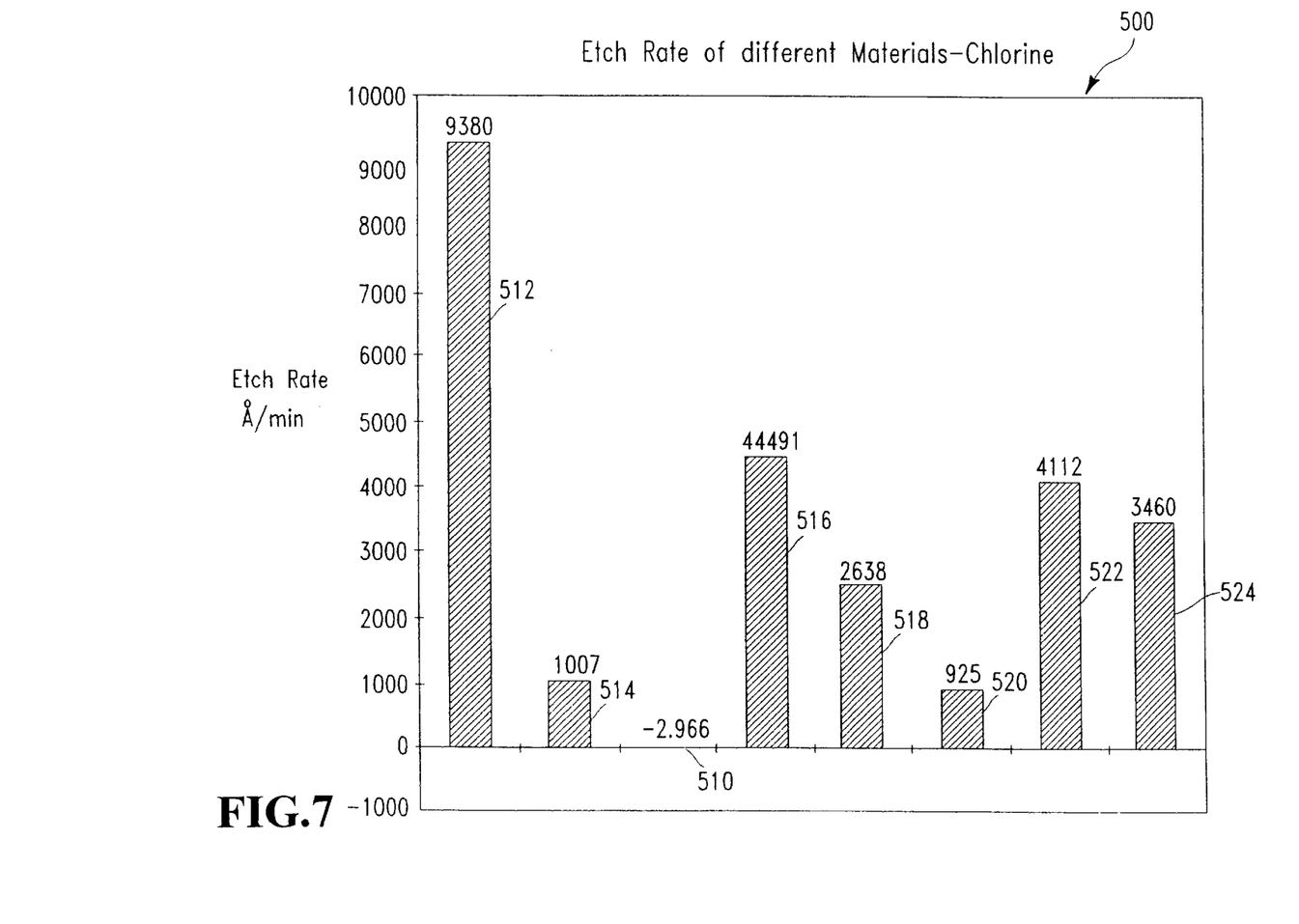
FIG. 7 is a block diagram showing the comparative etch rate of the same materials as shown in FIGS. 3 and 4, under the same process variable conditions, except that chlorine was used as the sole feed gas to the etch chamber. The etch rate for copper shown in the figure is negative, as the copper is not etched. Due to corrosion of the copper, the film thickness is increased rather than decreased.

FIG. 7 provides a block diagram 700 of the etch rate attainable for a patterned copper film, with comparative etch rates for a number of different materials when chlorine is the sole feed gas to the etch chamber. The etch variables were as specified for Example One, except for the chlorine feed gas and a fixing of the bias power applied to the substrate support platen at 200 W. The number at the top of an individual block is the etch rate in Å/min as measured. The block identified as "710" represents copper; block "712" represents aluminum; block "714" represents silicon dioxide; block "716" represents tantalum; block "718" represents tantalum nitride; block "720" represents tungsten, block "722" represents titanium nitride, and block "724" represents i-line photoresist.

As is evident from block diagram 700, there is a marked difference in etch rate between copper and many of the compounds and elements which are likely to be present in layers adjacent to the copper layer. In particular, the measured copper etch rate is negative because the copper corrosion during etch causes the copper film thickness to increase.

To provide a comparative example of the corrosion of copper which occurs on reactive ion etching with a chlorine-comprising etch gas, we etched 0.4 μm wide copper lines and spaces on a sputtered copper film surface pattern masked with a silicon oxide hard mask. The copper film overlaid a barrier layer of tantalum, which overlaid a silicon oxide surface, as previously described. The copper film was etched using chlorine gas in the manner described with reference to FIG. 3, except that the following gas flow rates were used 100 sccm argon, 25 sccm of $Cl_2$, and 50 sccm of $N_2$.

Figure 8A:
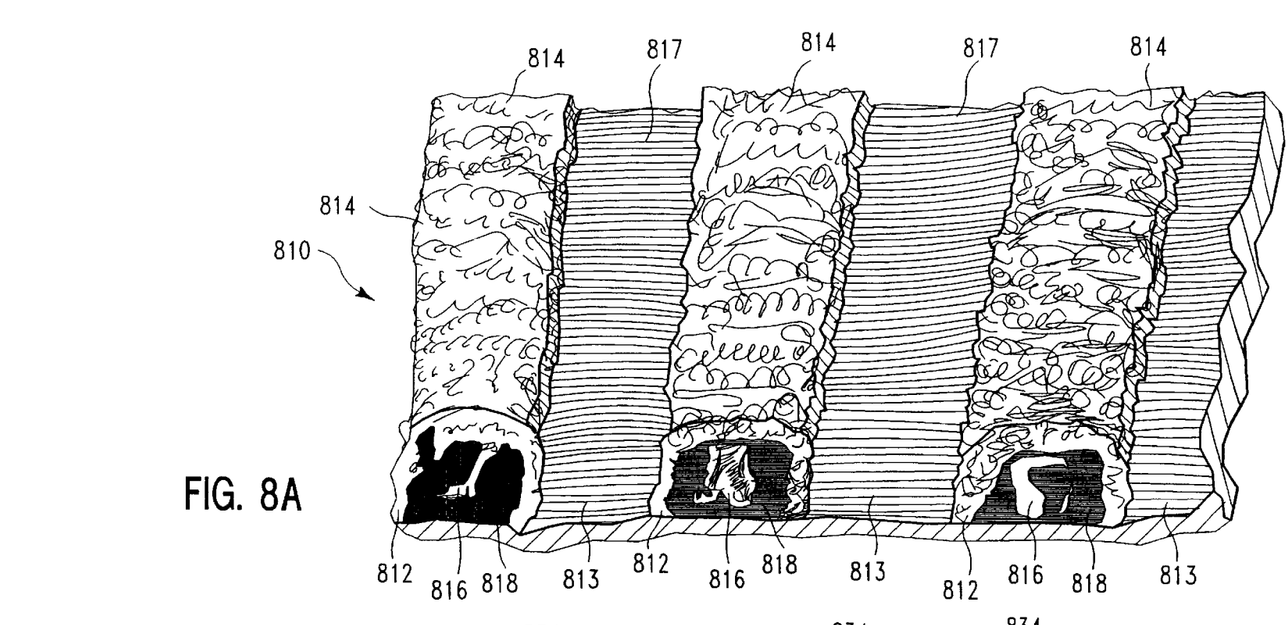
FIGS. 8A and 8B are each a schematic representation of a photomicrograph where reactive ion etching was used to etch the copper; and, where the chlorine concentration in the feed gas to the etch chamber and the etch chamber pressure were such that the copper became extremely corroded.

FIGS. 8A and 8B show schematics 810 and 830, respectively, of photomicrographs of a copper film which was reactive ion etched to provide 0.4 μm wide lines and spaces. With reference to FIG. 8A, lines 812 were so corroded that the surface 814 of the lines appears frothy and flaky from the reaction which created copper-containing compounds, in particular $CuCl_x$ where x ranges from 1 to 2. A small island 816 appears in the center of the line 812 and is apparently residual copper which has not yet been corroded. Between surface 814 of line 812 and island 816 is a hollow, empty space 818 which has been completely vacated due to the chemical reaction between the chlorine and the copper. Spaces 813 have a surface 817 which is the silicon oxide surface layer underlaying the copper film which was etched to provide lines 812 and spaces 813.

Figure 8B:
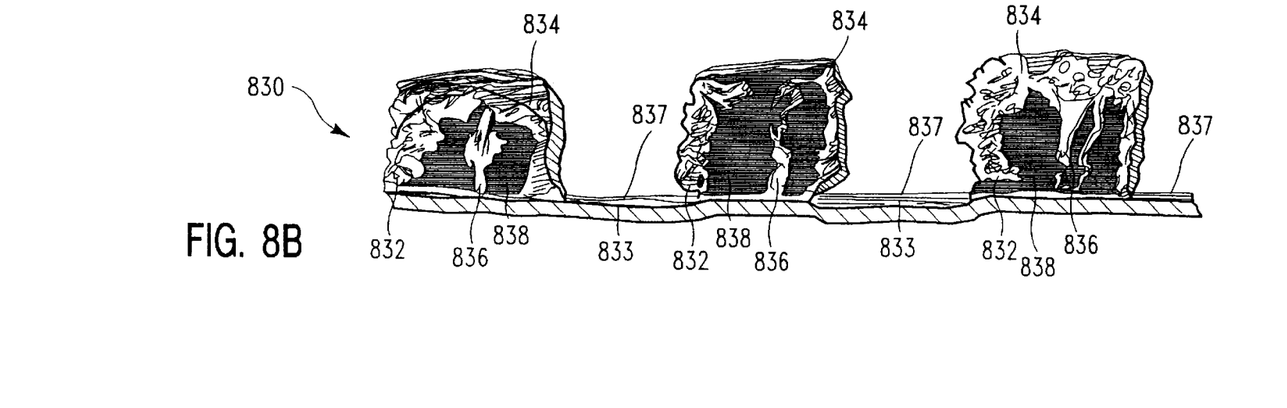

With reference to FIG. 8B, the lines 832 and spaces 833 are basically the same as the FIG. 8A lines 812 and spaces 813, but with more detail of the frontal edge of the line. A small island 836 appears in the center of line 832, with a hollow space 838 between the outer periphery 834 of line 832 and the center island 836. Once again, center island 836 is believed to be copper which has not yet been reacted to create a chlorine-containing compound. Spaces 833 have a surface 837 which is the silicon oxide layer underlaying the copper film which was etched to provide lines 832 and spaces 833.

EXAMPLE FIVE

Figure 9A:
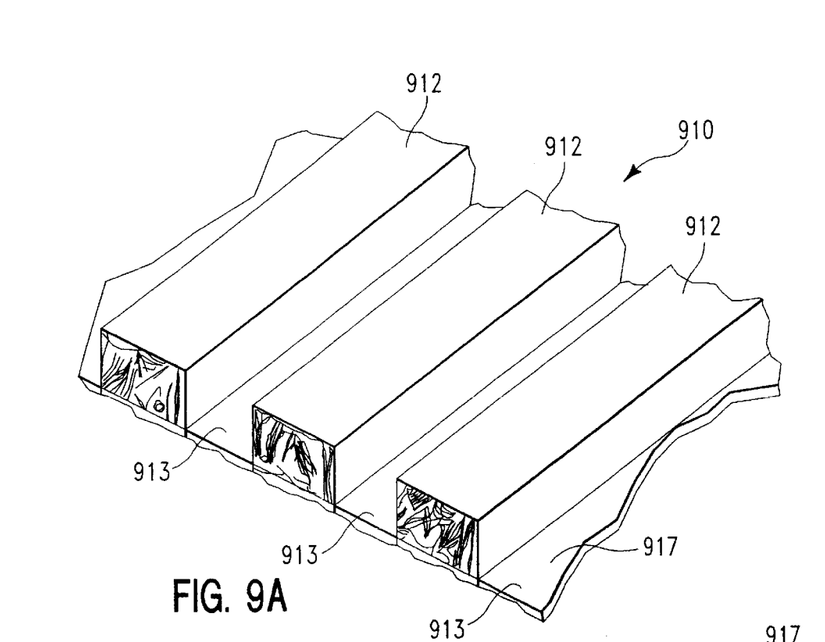
FIGS. 9A and 9B are each a schematic representation of a photomicrograph where reactive ion etching was carried out in a physically dominated etch regime and the copper was not corroded.
Figure 9B:
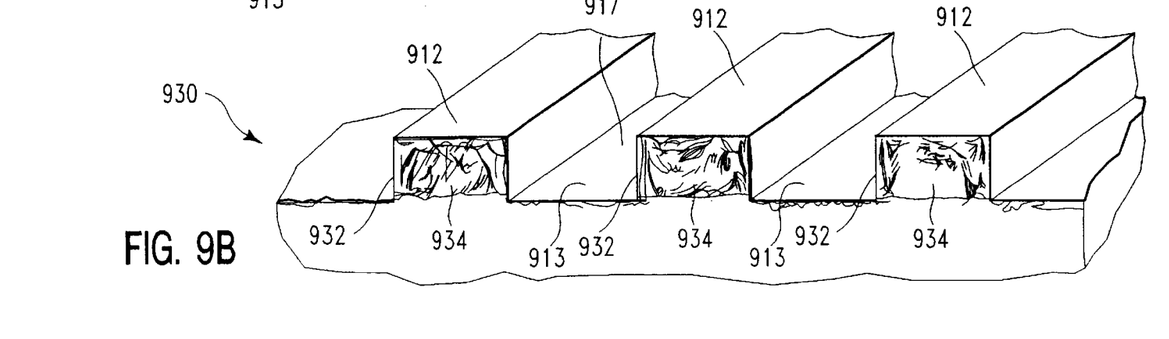

Patterned Copper Etch Using a Reactive Ion Etch Component, but in a Physically Dominated Etch Regime It is possible to use a reactive ion etch component in patterned copper etching without creating the kind of corrosion illustrated in FIGS. 8A and 8B. The non-corrosive etching is carried out under conditions which provide a physical bombardment dominated etch. FIG. 9A is a schematic of a photomicrograph 910 showing an etched copper film having 0.5 μm wide copper lines 912 and spaces 913. FIG. 9B is a schematic of a photomicrograph 930 showing the end 932 profile for photomicrograph 910 in more detail. The copper lines 912 and spaces 913 were etched on a sputtered copper film surface, pattern masked with a silicon oxide hard mask underlaid by a thin film of tantalum, as previously described. The copper film overlaid a tantalum barrier layer which was deposited on a silicon dioxide surface. The gas feed rates to the etch chamber were 140 sccm of argon, 15 sccm of chlorine, and 5 sccm of $N_2$. Power to the induction coil was 1,500 W at 2 MHz. The bias power to the substrate support platen was 400 W at 13.56 MHz. The Pressure in the etch chamber was 10 mT, and the substrate surface temperature was approximately 190° C. The preferred substrate temperature is in excess of about 150° C., and preferably less than about 350° C., to avoid harming the device. Substrate surface temperatures in this range help prevent absorption of reactive ion species on film surface and to help volatilize some species such as $CuCl_x$, enabling these species to leave the film surface. The etch chamber wall temperature was about 80° C.

At the gas flow rates described above, the volume % of chlorine gas in the etch chamber was about 15%. Lines 912, as illustrated in FIG. 9A, exhibited a straight sidewall profile and showed no evidence of corrosion. The end 932 profile of line 912, as illustrated in FIG. 9B, shows that the copper cross section 934 of line 912 is solid, further evidencing the avoidance of corrosion. Spaces 913 have a surface 917 which is the silicon oxide layer underlaying the copper film which was etched to provide lines 912 and spaces 913.

A physical bombardment dominated etch process can be maintained by decreasing the reactive gas content to one at which there is a 50% or less reduction or increase in etch rate if the remaining reactive gas is entirely removed from the etch gas feed, all other variables held constant. One skilled in the art will want to optimize the reactive gas content and the etch chamber pressure to provide the minimum reactive ion activity necessary to produce the desired etched feature profile. In addition, a lower etch chamber pressure permits the easier evaporation of etch by-products, while a higher chamber pressure enables an increase in the residence time of passivation species during the anisotropic etch of small features. This variable should also be optimized.

Another method of ensuring a physical bombardment dominated etch process at a given reactive gas concentration (up to a nominal limit) is to increase ion bombardment action at the surface of the copper film. The ion bombardment action can be increased by increasing the bias power to the substrate support platen; by reducing the frequency at a given power level; and, by increasing the ratio of the bias grounding area to the area of the substrate. In this latter instance, with reference to FIG. 1, an increase in the internal surface area of chamber 10 wall 30 relative to the surface area of substrate 14 would result in such an increased ratio.

In addition, by increasing the ion bombardment activity, small amounts of residual reactive gas component, such as chlorine, which may remain on the copper surface may be sputtered away from the surface.

Once the non-corroded etched feature is created, a capping layer can be applied to the copper surface to prevent future corrosion. Preferred capping layers include silicon nitride and polymers having a low dielectric constant. These capping layers can be generated by adding nitrogen and/or various hydrocarbon species to an inert carrier gas, forming a plasma, and plasma sputtering against a silicon oxide-containing surface, such as a silicon oxide hard mask.

The above described preferred embodiments are not intended to limit the scope of the present invention, as one skilled in the art can, in view of the present disclosure, expand such embodiments to correspond with the subject matter of the invention claimed below.

We claim:

1. A patterned plasma etched copper feature having an interior essentially free from halogen comprising species from a plasma etch process comprising a halogen species, which species are capable of chemically reacting with copper interior of said copper feature.

2. The patterned plasma etched copper feature of claim 1, wherein etching of said feature was carried out using enhanced physical bombardment.

3. The patterned plasma etched copper feature of claim 1, wherein etching of said feature was carried out using a halogen-comprising species in a physical bombardment dominated etch regime.

4. The patterned plasma etched copper feature of claim 1, wherein said interior is essentially free of halogen-comprising species generated from a compound selected from the group consisting of $Cl_2$, HCl, $BCl_3$, HBr, $CHF_3$, $CF_4$, $SiCl_4$, and combinations thereof.

* * * * *